(12) United States Patent
Chan et al.

(10) Patent No.: US 6,312,874 B1
(45) Date of Patent: Nov. 6, 2001

(54) METHOD FOR FORMING A DUAL DAMASCENE TRENCH AND UNDERLYING BORDERLESS VIA IN LOW DIELECTRIC CONSTANT MATERIALS

(75) Inventors: Simon S. Chan, Saratoga; Fei Wang; Todd Lukanc, both of San Jose, all of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/187,232

(22) Filed: Nov. 6, 1998

(51) Int. Cl.[7] .................................................. G03C 5/00
(52) U.S. Cl. ......................... 430/314; 430/316; 430/317
(58) Field of Search ................................. 430/312, 314, 430/316, 313, 317; 216/39

(56) References Cited

U.S. PATENT DOCUMENTS

| | | | |
|---|---|---|---|
| 5,741,626 | * 4/1998 | Jain et al. ............................. | 430/314 |
| 5,914,202 | * 6/1999 | Nguyen et al. ........................ | 430/5 |
| 5,916,733 | * 6/1999 | Koyama ................................ | 430/296 |
| 5,935,762 | * 8/1999 | Dai et al. .............................. | 430/312 |
| 5,989,997 | * 11/1999 | Lin et al. .............................. | 438/622 |
| 6,040,243 | * 3/2000 | Li et al. ................................ | 438/687 |

* cited by examiner

Primary Examiner—Mark F. Huff
Assistant Examiner—Saleha R. Mohamedulla (57) ABSTRACT

A method of forming a dual damascene structure in low k dielectric material employs a multiple layer hard mask over the low k dielectric layer. The trench pattern is etched into the hard mask layer, followed by etching of a via pattern. The trench pattern is widened to completely coincide with the via if the via does not fall completely within the trench pattern due to alignment errors. The low dielectric constant material is protected from the photoresist removal process during the patterning and initial formation of the trench and via in the multiple layer hard mask.

16 Claims, 5 Drawing Sheets

METHOD FOR FORMING A DUAL DAMASCENE TRENCH AND UNDERLYING BORDERLESS VIA IN LOW DIELECTRIC CONSTANT MATERIALS

FIELD OF THE INVENTION

The present invention relates to the field of interconnects in semiconductor devices, and more particularly, to methods for forming dual damascene structures in low dielectric constant materials.

BACKGROUND OF THE INVENTION

Integrated circuit fabrication typically begins with a thin, polished slice of high-purity, single crystal semiconductor material, usually silicon. Junctions (which make up devices) are formed between field oxide portions of the semiconductor slice. Metal lines in conductor layers provide necessary electrical connections between the devices. Dielectric (i.e. insulating) layers are formed between the conductor layers to isolate the metal lines from each other. Vias provide conducting paths through the dielectric layers to connect the interconnects of different conductor layers.

As micro-miniaturization of integrated circuits has increased, the smaller features have presented challenges to the semiconductor fabrication engineer. For example, the vias for connecting the interconnects are normally designed to be fully landed on the underlying structure. However, allowing only fully landed openings on increasingly narrow metal features results in extremely small contact or via holes. This in turn can result in very difficult via lithography and increased contact or interface resistance between all of the overlying metal structure and the underlying interconnect structure due to the decreased contact area. Borderless vias, which are not required to fully land on the underlying structure, have therefore found acceptance in the semiconductor industry due to their larger size and decreased resistance.

In high performance integrated circuits in the sub-0.25 $\mu$m regime, there is a need to fabricate interconnects using so-called damascene techniques. This is because conventional deposition and etching of aluminum-based metalization becomes increasingly difficult at these feature sizes. At the same time, performance considerations call for the use of lower resistivity metals such as copper, which has proven extremely difficult to pattern using conventional reactive ion etching. The desire to use copper for interconnects has increased the attractiveness of damascene techniques and spurred investigation into improving these techniques.

In addition to using low resistivity metals such as copper, circuit performance enhancement has been sought by combining the copper conductors with low dielectric constant insulators (k less than approximately 4). In many cases, these low k materials are spin-coated polymers which are incompatible with conventional photoresist stripping using oxygen ashers or solvents. The patterning of the low k materials to form the trenches and vias of a damascene structure is a difficult task due to the incompatibility of the low k materials with conventional photoresist stripping. The difficulties in patterning are exacerbated if the vias are allowed to be the borderless type.

An example of a dual damascene process sequence using a low k dielectric, having trenches with underlying via holes that are etched in the low k dielectric material before metal deposition and chemical-mechanical polishing (CMP), is depicted in FIGS. 1A–1D. This commonly used method of forming the trenches together with the via holes employs etch stop layers and photoresist masks. A bottom stop layer 14, such as silicon nitride, has been deposited over an existing interconnect pattern formed in an interconnect layer 10. The interconnect pattern may be formed from a conductor 12, such as copper. A layer of low k material 16 is then deposited on the bottom stop layer. The via will be formed within this low k dielectric layer 16.

Figure 1A:
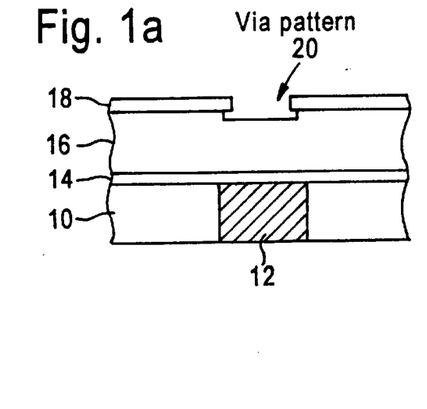
FIGS. 1A–D depict a method of forming a dual damascene trench and via structure using low k dielectric materials.

A middle stop layer 18, such as silicon dioxide, is deposited over the low k dielectric layer 16. A via pattern 20 is etched into the middle stop layer 18 using conventional photolithography and appropriate anisotropic dry etching techniques. (These steps are not depicted in FIG. 1A. Only the resultant via pattern 20 is depicted in FIG. 1A.) The photoresist used in the via patterning is removed by an oxygen plasma, which consumes some of the exposed low k material, as indicated in FIG. 1A.

Figure 1B:
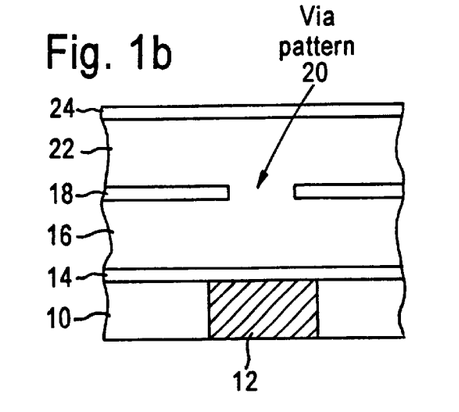
Figure 1C:
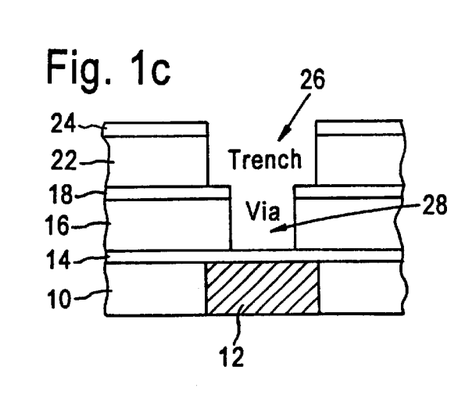

FIG. 1B depicts the structure of FIG. 1A after a second layer of low k dielectric material has been spin-coated on the middle stop layer 18 and through the via pattern opening 20. Due to the nature of spin-coated materials, the structure is planarized at the same time. Following the spin-coating and the planarization of the low k dielectric layers 22, in which the trench will be formed, a hard mask layer 24 is deposited. The hard mask layer 24 may be silicon dioxide, for example.

The trench pattern is then formed in a photoresist layer (not depicted) which is aligned over the via pattern, using conventional photolithography. The structure is then exposed to an anisotropic dry etch configured to etch through the hard mask layer 24. The etch chemistry is then changed to one which selectively etches the low k dielectric material in the low k dielectric layers 22 and 16, but not the hard mask layer 24 nor the middle and bottom stop layers, 18 and 14. In this way, a trench 26 and a via 28 are formed in the same etching operation.

Figure 1D:
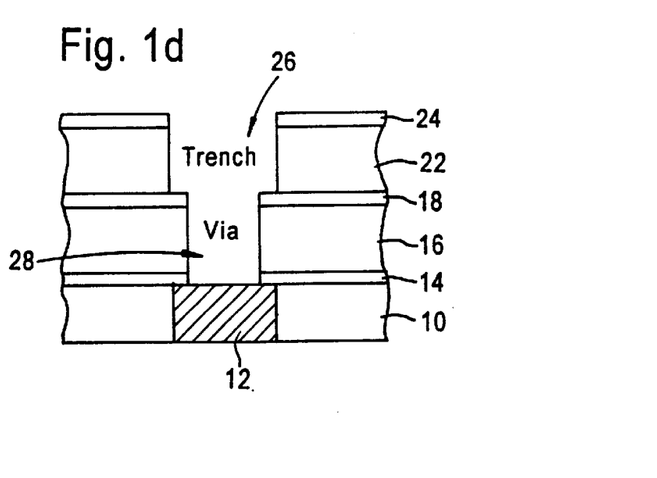

In most cases, the low k etch chemistry etches the photoresist at approximately the same rate as the low k dielectric. The thickness of the trench photoresist is selected to be completely consumed by the end of the etch operation, to eliminate the need for photoresist stripping. This results in the structure depicted in FIG. 1C, in which all of the photoresist has been stripped and the trench 26 and via 28 have been formed. The bottom stop layer 14 is then removed by a different selective dry etch chemistry designed not to attack any other layers in order to expose conductor 12 to which the via is making a connection. The resulting structure is depicted in FIG. 1D. The bottom stop layer is normally used to protect the pre-existing interconnect layer from oxidation or corrosion during dry etching. If such concerns do not exist, bottom stop layer 14 and the corresponding bottom stop layer etching step is omitted.

The processing sequences depicted in FIGS. 1A–D are adequate if a sufficient overlay margin between the trenches and the vias is designed in the process to guarantee that the via openings will never fall outside the trench openings with the expected amount of overlay error. However, beginning with the 0.25 $\mu$m generation of integrated circuits, the overlay accuracy of photolithography equipment becomes a significant fraction of the minimum feature size. As a result of circuit compactness considerations, situations where the overlap between the conductor lines and vias is smaller than the expected alignment accuracy must be allowed. These vias are described as "borderless" or "unlanded", and are allowed to "fall off" the lower and upper conductor lines due to the expected alignment limitations, to the extent that unintentional short circuits can still be avoided.

Figure 2:
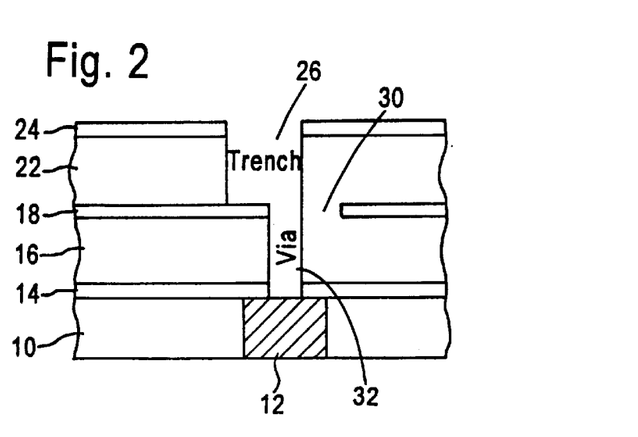
FIG. 2 is a cross-sectional view of an exemplary dual damascene trench and via formation in low k dielectric layers when the borderless via has been misaligned in accordance with the prior art methods of processing.

FIG. 2 depicts a dual damascene structure in which a borderless via has been misaligned during the dual damascene trench and via formation in low k dielectrics. In dual damascene processing sequences that use a buried stop layer, such as the stop layer 18 in FIGS. 1A–1D, a via hole opening 30 etched in stop layer 18 that partially falls outside the trench opening 26 over it due to misalignment will result in a reduction in the final via size. This is due to the anisotropic etching of the low k dielectric material in the two low k dielectric layers being performed only in accordance with the intended trench opening in the hard mask layer 24. The area of the via opening 30 that does not fall within the trench opening due to misalignment will not be etched resulting in a smaller-sized via 32. Since the final size of the via 32 has thus been reduced, the via resistance is increased. The reduction in the final via size also makes it more difficult to achieve good barrier metal step coverage and void-free conductor filling.

SUMMARY OF THE INVENTION

There is a need for a method of forming a dual damascene trench and via structure in low dielectric constant materials in which the final via size is not affected by misalignment between the trench and via patterns even if the vias are borderless.

This and other needs are met by the present invention which provides a method of forming a dual damascene structure in low dielectric constant materials comprising the steps of creating a via opening in a first low k dielectric layer. A trench opening is created in a second low k dielectric layer. Photoresist material is removed through a photoresist removal process during the creation of the via opening and the trench opening. During the steps of creating a via opening and creating a trench opening, exposure of the first and second low k dielectric layers to the photoresist removal process is prevented.

One of the advantages of the present invention is that it avoids the exposure of low k dielectric material to oxygen ashers and solvents. At the same, the present invention allows for borderless vias, and ensures that the via size will be independent of overlay errors. The present invention allows for a complete overlap of the trenches with the underlying vias. A dual damascene process for low k materials is thus provided by the present invention.

In certain embodiments of the invention, a multiple layer mark is provied on the uppermost low k dielectric layer. The trench pattern is formed first in the uppermost layer of the multiple layer hard mask and the photoresist used to pattern the trench is then removed. Photoresist is then deposited over the now patterned uppermost layer of the multiple layer hard mask. The photoresist is then patterned to form a via pattern. The multiple layer hard mask is then etched again, as well as any material of the uppermost layer that remains within the via opening, to the lower layer of the multiple layer hard mask. This ensures that the via will be provided with its full width since it has been patterned after the trench has been patterned. The via photoresistant may then be removed. Etching of the multiple layer hard mask and the low k dielectric layers then continues to form the trenches and vias.

One of the advantages of patterning the trench, followed by patterning the via, is that the via is guaranteed a full width, while still providing for a complete overlay of the trench on the via. In other words, in contrast to the prior art in which a misaligned via is narrowed while the trench maintains its initial width, in the present invention the via maintains its desired width, while the trench is widened to completely overlay the via.

The foregoing and other features, aspects and advantages of the present invention will become apparent from the following detailed description of the present invention when taken in conjunction with the accompanying drawings.

DETAILED DESCRIPTION OF EXEMPLARY EMBODIMENTS

The preset invention with embodiments depicted in FIGS. 3A–3J and 4A–4J, provide a processing sequence for forming a dual damascene trench and via structure in which the final via size is not affected by misalignment between the trench and via patterns if the vias are borderless (i.e. expected to fall off with the anticipated misalignment). Furthermore, the embodiments of the present invention ensure that there will always be full coverage of the top metal line with the underlying via after the barrier and conductor metal filling and chemical-mechanical polishing (CMP) are completed. Furthermore, exposure of the first and second low k dielectric layers to the photoresist removal process is prevented during the creation of the via and trench openings. As will be seen from the following description and the accompanying figures, exposure of the low k dielectric material to oxygen ashing or solvent resist stripping is prevented by using a multiple layer hard mask.

A first embodiment of the present invention is depicted in FIGS. 3A–3J, showing a cross-section of an interconnect portion of a semiconductor wafer, for example. As shown in FIG. 3 A, a conductor 42 having a low resistivity, such as copper, is provided in an interconnect layer 40. A bottom stop layer 44, made of silicon nitride, for example, is deposited on the interconnect layer 40 and conductor 42. The bottom stop layer protects conductor 42 during dry etching of the upper dielectrics. A first low k dielectric layer 46 is then formed by spin-coating, for example, on the bottom stop layer 44. The first low k dielectric layer 46 may be made of a suitable material, such as benzocyclobutene (BCB). This material is considered a low k dielectric material since its dielectric constant is less than about 4. A middle stop layer 48 is deposited on the first low k dielectric layer 46. In preferred embodiments, the first low k dielectric layer 46 is the layer in which the via will eventually be formed.

After formation of the middle stop layer 48, the second low k dielectric layer 50 is spin-coated onto the middle stop layer 48. This layer 50 may be made of the same material as the first low k dielectric layer 46. In preferred embodiments of the present invention, the second low k dielectric layer 50 is the layer in which the trench is ultimately formed. One difference between the present invention and the conventional methods described in FIGS. 1A–1D is manifested at this stage. In conventional methods, the middle stop layer has been etched to form the via pattern in the middle stop layer prior to the spin-coating of the second low k dielectric layer. By contrast, in the present invention, the middle stop layer 48 remains intact with the second low k dielectric layer 50 being spin-coated on the top surface.

A multiple layer hard mask 58 is then deposited as a series of three layers, for example. A first mask layer 52, formed of silicon dioxide, for example, is deposited on the second low k dielectric layer 50. This is followed by the deposition of an intermediate mask layer 54, made of silicon nitride, for example, on the first mask layer 52. The multiple layer hard mask 58 is completed in the exemplary embodiment by a second mask layer 56, made of silicon dioxide, for example. The second mask layer 56 in the multiple layer hard mask 58 is made thicker than the first mask layer 52, for reasons that will be given below. For example, the first mask layer 52 may be 1000 Å thick, and the second mask layer 56 may be 2000 Å thick. The intermediate mask layer 54 may be 1000 Å thick, in certain preferred embodiments. These thicknesses are exemplary only, as other thicknesses may be used without departing from the spirit or scope of the present invention.

Figure 3A:
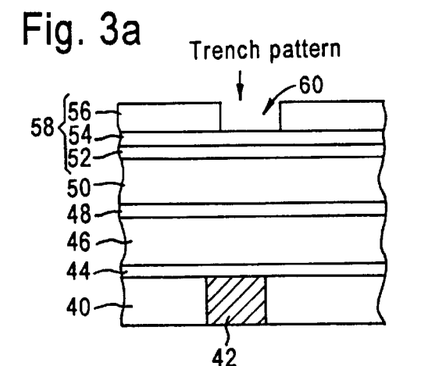
FIGS. 3A–3J depict cross-sectional views of the interconnect portion of a semiconductor wafer during a manufacturing process thereof to form a dual damascene structure with a trench and via formation in accordance with certain embodiments of the present invention.

A photoresist material is then deposited over the second mask layer 56 and patterned by using conventional photolithography to provide a trench pattern. This trench pattern is then etched into the second mask layer 56 using, a selective anisotropic dry etch without substantially etching the rest of the layers, to form a trench pattern 60 in the second mask layer 56. The photoresist is then removed by conventional ashing and/or solvents. This may be done without affecting the low k dielectric layers 50 and 46 since they are still protected by the remaining two layers 54, 52 of the multiple layer hard mask 58. The resulting structure is depicted in FIG. 3A.

Figure 3B:
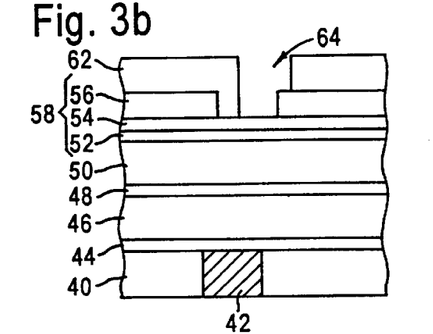

After the trench pattern 60 has been formed in the second hard mask layer 56, a new photoresist layer 62 is deposited over the second hard mask layer 56. The photoresist pattern for the via is defined and overlaid on the trench pattern (FIG. 3B). Note that the via photoresist pattern may "fall off" the trench pattern due to an expected amount of misalignment that is allowed. The structure is then exposed to the same selective dry etch for etching the second mask layer 56 in the multiple layer hard mask 58. This ensures that any of the areas of the second hard mask layer 56 exposed by the misalignment will be removed. The via size defined by the via photoresist opening 64 will be guaranteed and result in complete coverage of the final via structure by the overlaying metal line as will be apparent from the later description. Hence, the trench pattern is defined first within the second mask layer 56, followed by further definition of the second mask layer 56 to define the via opening. An exemplary etch chemistry to etch the second mask layer, made of silicon dioxide, for example, is $C_4F_8$.

Figure 3C:
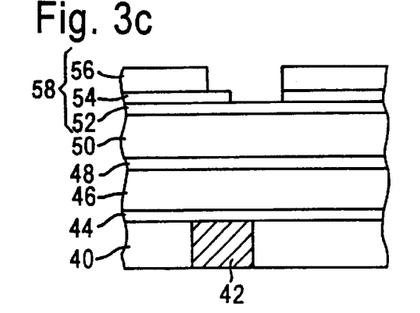

The via pattern is then etched through the intermediate mask layer 54, made of silicon nitride for example, using an etching chemistry that stops at the first mask layer 52. This transfers the via pattern into the intermediate mask layer 54. The trench opening is still defined in the second mask layer 56, but now is wider since it also covers the misaligned portion of the via. At this point, the via photoresist is removed using conventional oxygen ashing and/or solvents. The low k dielectric layers 50, 46 are still protected by the first mask layer 52 and the multiple layer hard mask 58. A suitable etch chemistry for etching the intermediate mask layer 54 includes plasma containing $CHF_3$ and $O_2$. Following removal of the photoresist, the structure is as depicted in FIG. 3C.

Figure 3D:
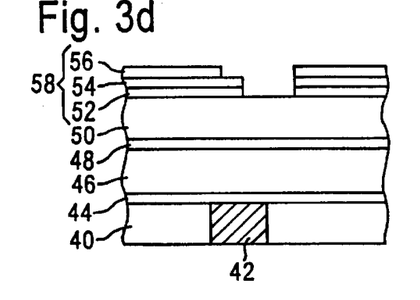

In the next step of the process, the via pattern is transferred to the first mask layer 52 in the multiple layer hard mask 58. The structure is exposed to an anisotropic dry etch to selectively etch the first hard mask layer 52 using the intermediate mask layer 54 immediately above it as a mask. At the same time, the second hard mask layer 56 will be etched, but a fraction of the second hard mask layer 56 will remain since it was originally deposited with a greater thickness than the first mask layer 52. A suitable etchant to etch the first mask layer 52 is $C_4F_8$. The resulting structure is depicted in FIG. 3D.

Figure 3E:
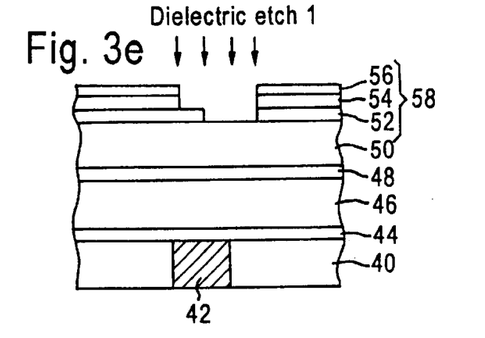

The etch chemistry is now changed back to $CHF_3$ and $O_2$ in order to selectively etch the intermediate mask layer 54 using what remains of the second hard mask layer 56 as a mask. This action transfers the trench pattern to the intermediate mask layer 54 in the multiple layer hard mask 58. The resulting structure is depicted in FIG. 3E.

Figure 3F:
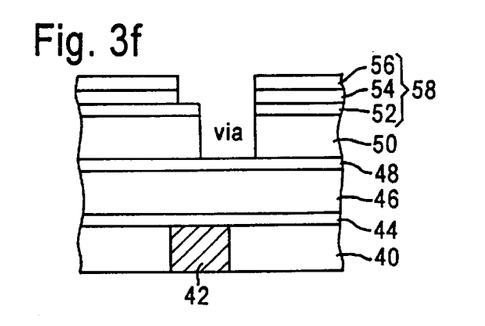
Figure 3G:
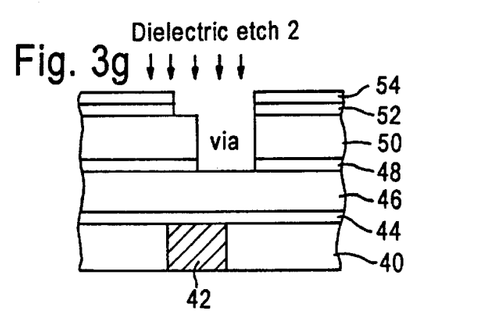

The etching chemistry is now changed to one which will selectively etch the second low k dielectric layer 50 without substantially attacking any other layer (dielectric etch 1). An example of such a chemistry is an $O_2$ and Ar based plasma. This creates a via that reaches down to the middle stop layer 48. The resulting structure is depicted in FIG. 3F. The etch chemistry is now changed to one suitable for removing the middle stop layer 48 without attacking substantially any other layer. When the middle stop layer 48 is made of the same material as the first mask layer 52 and second mask layer 56, for example silicon dioxide, the same etch chemistry may be used as that employed to etch the first mask layer 52. In this step, the portion of the middle stop layer 48 exposed by the via etched in the second low k dielectric layer 50 is removed. At the same time, the etch chemistry also removes any material remaining in the second mask layer 56, as well as the portions of the first mask layer 52 exposed by the trench pattern in the intermediate mask layer 54. The resulting structure is depicted in FIG. 3G.

Figure 3H:
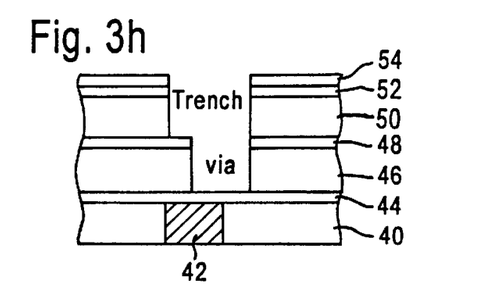

The etch chemistry is now changed to one that selectively etches both the first and second low k dielectric layers 46, 50, while stopping at the middle stop layer 48 for the trenches and the bottom stop layer 44 for vias (dielectric etch 2). A suitable etch chemistry is again an $O_2$ and Ar based plasma. The resulting structure is depicted in FIG. 3H.

Figure 3I:
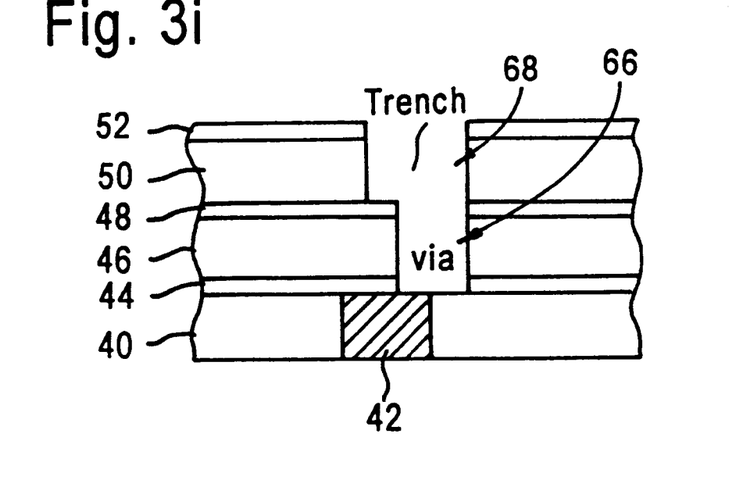

An etch chemistry is now used to selectively etch the bottom stop layer 44 within the via opening and at the same time remove the intermediate mask layer 54 in the multiple layer hard mask 58. When silicon nitride is used as the intermediate mask layer 54 and the bottom stop layer 44, a suitable etch chemistry is $CF_4$. The resulting structure is depicted in FIG. 3I. This completes the formation of the openings for the dual damascene trench and via structure. The via is defined by the opening 66, while the trench is defined by opening 68. The first mask layer 52 remains and may be used as a CMP stop layer during CMP.

In certain embodiments, the bottom stop layer 44 is omitted. In these embodiments, the pre-existing interconnect layer 40 does not need to be protected from oxidation or corrosion during the dry etching steps.

Figure 3J:
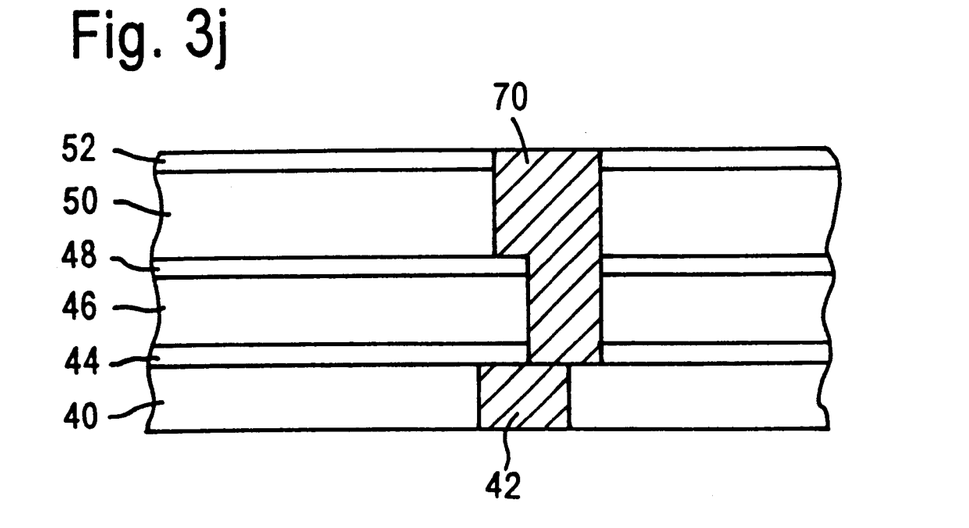

Following formation of the trench 68 and the via 66, a conductive material 70 may be deposited through any of various means into the openings and polished back by CMP as depicted in FIG. 3J. Suitable conductive materials include low resistivity metals such as copper and associated barrier metals.

FIGS. 4A–4J depict another embodiment of the present invention which is similar to that depicted in FIGS. 3A–3J, but does not use a middle stop layer 48 (a "buried" stop layer). This embodiment may be employed if the first and second low k dielectric layers are of the same material (such as BCB) and the etching is sufficiently well controlled by time. A suitable etch chemistry is an $O_2$ and Ar based plasma. The middle stop layer 48 is typically silicon dioxide with a dielectric constant of approximately 4. The removal of this stop layer 48 in this embodiment results in a reduction in the interconnect capacitance and is therefore advantageous.

Figure 4A:
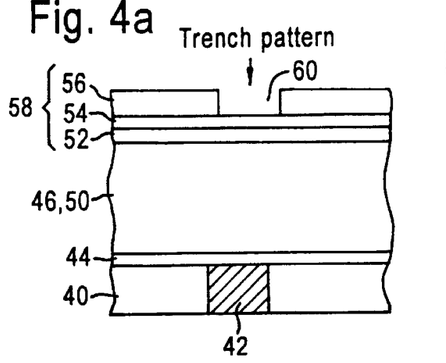
FIGS. 4A–4J depict cross-sectional views of the interconnect portion of a semiconductor wafer during a manufacturing process thereof to form a dual damascene structure with a trench and via formation in accordance with alternative embodiments of the present invention.
Figure 4B:
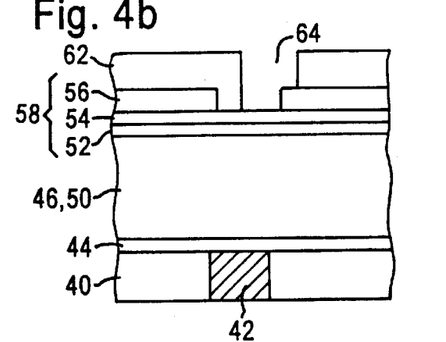
Figure 4C:
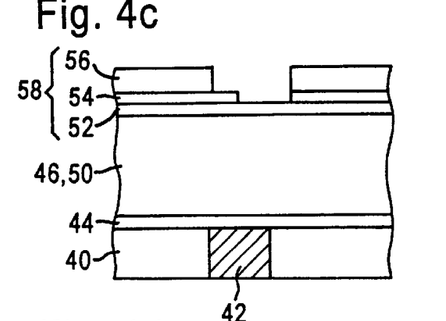
Figure 4D:
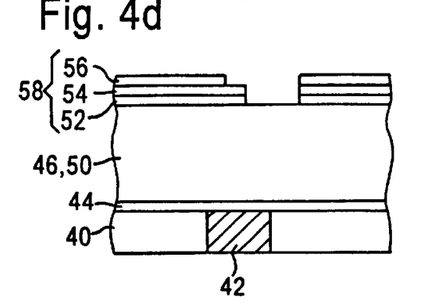
Figure 4E:
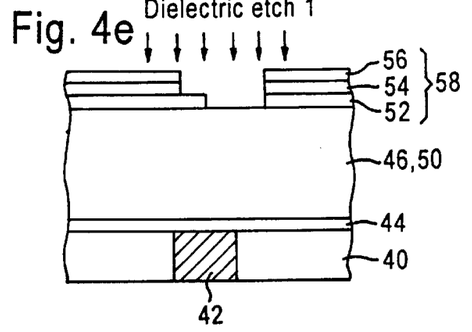
Figure 4F:
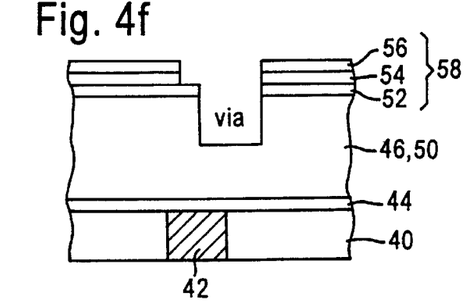
Figure 4G:
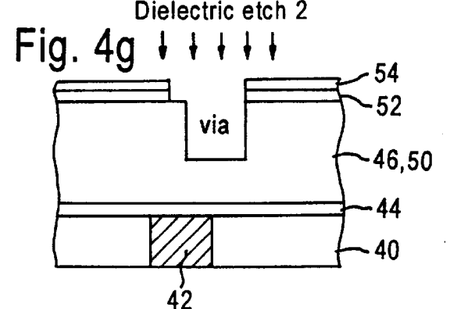

In this alternative embodiment, a bottom stop layer 44 is first deposited over interconnect layer 40 and conductor 42. A thicker low k dielectric layer (46, 50) is deposited over the bottom stop layer 44 and serves as the integrated equivalent of the low k via dielectric 46 and low k trench dielectric 50. A multiple layer hard mask 58 consisting of first mask layer 52, an intermediate mask layer 54 and a second mask layer 56 is deposited over the integrated via and trench low k dielectric layer (46, 50) as in the first embodiment. The trench pattern is transferred into the second mask layer 56 using an identical method as in the first embodiment to result in a structure as shown in FIG. 4A. The process steps needed to bring about the structural transformation from FIG. 4A to 4E are the same as those needed to effect the change depicted from FIG. 3A to 3E. The structure in FIG. 4E is then exposed to an anisotropic dry etch (dielectric etch 1) so that the via pattern is etched into the integrated via and trench low k dielectric (46, 50) to a depth determined by the etch time, as depicted in FIG. 4F. The etch chemistry is then changed back to the one that is used to etch the first mask layer 52. Any portion of the first mask layer 52 which is exposed plus any material remaining in the second mask layer 56 will be removed (as in the first embodiment), resulting in the structure depicted in FIG. 4G.

Figure 4H:
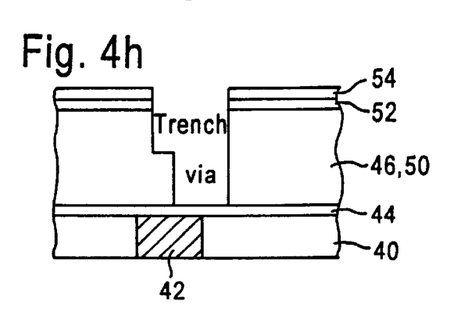
Figure 4I:
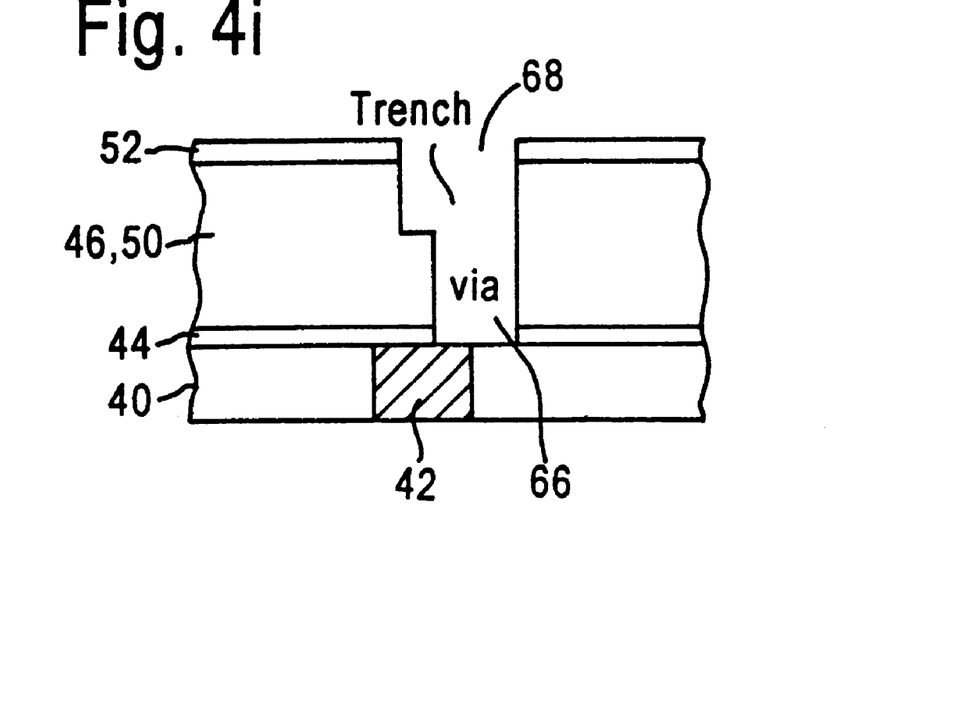
Figure 4J:
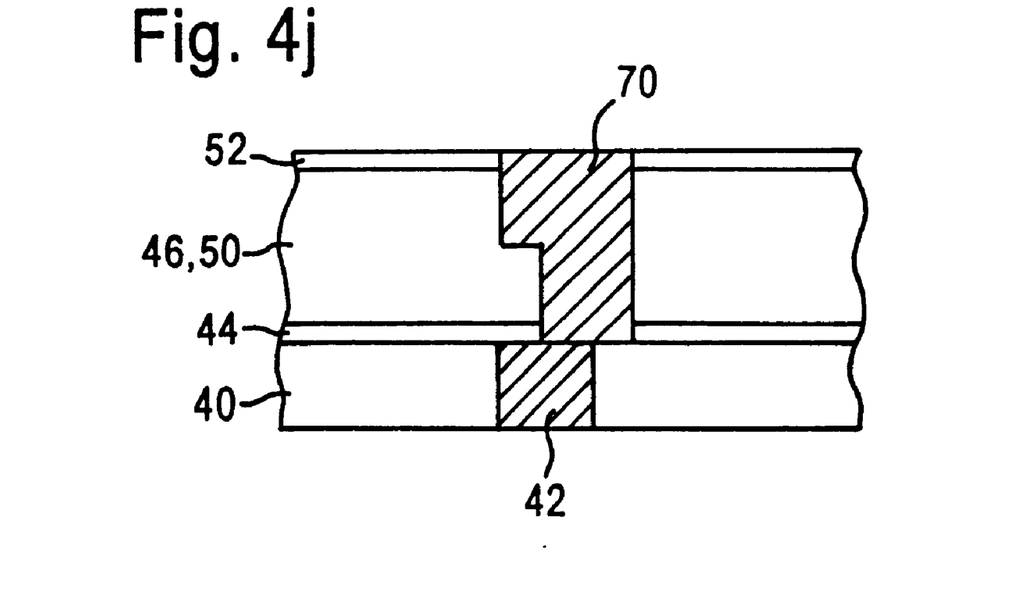

The structure is then exposed to an anisotropic dry etch chemistry (dielectric etch 2) which etches vertically all exposed areas of the integrated via and trench low k dielectric (46, 50) but does not etch the intermediate mask layer 54 in the multiple layer hard mask 58 or the bottom stop layer 44. A timed etch then defines the trenches and vias at the same time, as depicted in FIG. 4H. Another etch chemistry which selectively removes the intermediate mask layer 54 in the multiple layer hard mask 58 and bottom stop layer 44 without affecting conductor 42 by oxidation or otherwise (as in the first embodiment) results in the dual damascene structure depicted in FIG. 4I, with the via defined by opening 66 and the trench defined by opening 68. A conductive material 70 such as copper and associated barrier metals may then be deposited into the via and trench openings through any of various means and polished back by CMP as depicted in FIG. 4J. Again, the bottom stop layer 44 may be omitted if conductor 42 is not affected by the low k dielectric etch plasmas.

The present invention provides a dual damascene process sequence that achieves a complete overlap of trenches with underlying borderless vias in low dielectric constant materials in spite of overlay errors between trench and via alignment. This allows a via size to be independent of overlay errors, and avoids the exposure of low k dielectric material to oxygen ashers and solvents.

Although the present invention has been described and illustrated in detail, it is to be clearly understood that the same is by way of illustration and example only and is not to be taken by way of limitation, the spirit and scope of the present invention being limited only by the terms of the appended claims.

What is claimed is:

1. A method of forming a dual damascene structure in a semiconductor device, comprising the steps of:

creating a via opening in a first low k dielectric layer;

creating a trench opening in a second low k dielectric layer, wherein the steps of creating a via opening and creating a trench opening include removing photoresist material through a photoresist removal process; and preventing exposure of the first and second low k dielectric layers to the photoresist removal process during the steps of creating a via opening and creating a trench opening.

2. The method of claim 1, wherein the steps of creating a via opening and creating a trench opening include:

forming the second low k dielectric layer on the first low k dielectric layer; and forming a multiple layer hard mask on the second low k dielectric layer, the multiple layer hard mask having a first mask layer formed on the second low k dielectric layer, an intermediate mask layer formed on the first mask layer, and a second mask layer formed on the intermediate mask layer.

3. The method of claim 2, wherein the steps of creating a via opening and creating a trench opening include:

depositing photoresist material on the second mask layer;

patterning a trench in the photoresist material;

etching the trench in the second mask layer in accordance with the pattern in the photoresist material to the intermediate mask layer; and removing the photoresist material.

4. The method of claim 3, wherein the steps of creating a via opening and creating a trench opening include:

depositing photoresist material on the second mask layer after the trench pattern is formed in the second mask layer;

patterning a via in the photoresist material;

etching the via through the intermediate mask layer, and the second mask layer if the second mask layer is within the via, in accordance with the pattern in the photoresist material to the first mask layer; and removing the photoresist material.

5. The method of claim 4, wherein the steps of creating a via opening and creating a trench opening include etching the via through the first mask layer in accordance with the via etched in the intermediate mask layer.

6. The method of claim 5, wherein the steps of creating a via opening and creating a trench opening include etching the intermediate mask layer in accordance with the trench etched in the second mask layer.

7. The method of claim 6, wherein the steps of creating a via opening and creating a trench opening include etching through the second low k dielectric layer in accordance with the via etched in the first mask layer.

8. The method of claim 7, wherein the steps of creating a via opening and creating a trench opening include:

removing the second mask layer; and etching the first mask layer in accordance with the trench etched in the intermediate mask layer.

9. The method of claim 8, wherein the steps of creating a via opening and creating a trench opening include etching through the first low k dielectric layer in accordance with the via etched in the second low k dielectric layer and through the second low k dielectric layer in accordance with the trench etched in the first mask layer.

10. The method of claim 9, wherein the first low k dielectric layer directly overlays a bottom stop layer.

11. The method of claim 10, wherein the steps of creating a via opening and creating a trench opening include removing the bottom stop layer within the via opening etched in the first low k dielectric layer.

12. The method of claim 11, wherein the step of forming the second low k dielectric layer on the first low k dielectric layer includes forming the first and second low k dielectric layers as a single, integrated layer.

13. The method of claim 11, wherein the step of forming the second low k dielectric layer on the first low k dielectric layer includes forming an intermediate stop layer on the first low k dielectric layer and forming the second low k dielectric layer on the intermediate stop layer.

14. The method of claim 13, wherein the step of etching through the second low k dielectric layer in accordance with the via etched in the first mask layer includes stopping the etching at the intermediate stop layer.

15. The method of claim 14, further comprising removing the intermediate stop layer within the via etched in the second low k dielectric layer.

16. The method of claim 4, wherein the step of patterning a via in the photoresist material includes patterning the photoresist material such that a portion of the via pattern is outside of the trench pattern.

* * * * *